(12) United States Patent
Lee et al.

(10) Patent No.: US 10,892,766 B2
(45) Date of Patent: Jan. 12, 2021

(54) RECONFIGURABLE DIGITAL CONVERTER FOR CONVERTING SENSING SIGNAL OF PLURALITY OF SENSORS INTO DIGITAL VALUE

(71) Applicant: Daegu Gyeongbuk Institute of Science and Technology, Daegu (KR)

(72) Inventors: Jung Hyup Lee, Daegu (KR); Arup Kocheethra George, Daegu (KR); Wooyoon Shim, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 16/408,611

(22) Filed: May 10, 2019

(65) Prior Publication Data
US 2019/0348990 A1  Nov. 14, 2019

(30) Foreign Application Priority Data
May 11, 2018 (KR) .................. 10-2018-0054067

(51) Int. Cl.
*H03M 1/00* (2006.01)
*G01K 7/16* (2006.01)
(Continued)

(52) U.S. Cl.
CPC .............. *H03M 1/004* (2013.01); *G01K 7/16* (2013.01); *G01L 1/142* (2013.01); *G01N 27/223* (2013.01); *G06F 3/045* (2013.01)

(58) Field of Classification Search
CPC ...... H03M 1/004; H03M 1/005; H03M 1/007; H03M 1/008; G01K 7/16; G01K 7/22;
(Continued)

(56) References Cited

U.S. PATENT DOCUMENTS

| 8,581,447 B2 | 11/2013 | Jaeckle | |
|---|---|---|---|
| 2009/0039869 A1* | 2/2009 | Williams | .......... H01L 23/49575 324/123 R |

(Continued)

FOREIGN PATENT DOCUMENTS

| KR | 20100137506 | 12/2010 |
|---|---|---|
| KR | 20150001386 | 1/2015 |

(Continued)

OTHER PUBLICATIONS

George, "A 0.8 V Supply- and Temperature-Insensitive Capacitance-to-Digital Converter in 0.18-μm CMOS", IEEE Sensors Journal, vol. 16, No. 13, Jul. 1, 2016, 11 pages.

(Continued)

*Primary Examiner* — Diana J. Cheng
(74) *Attorney, Agent, or Firm* — Hauptman Ham, LLP

(57) ABSTRACT

A digital converter and a controlling method are disclosed. The digital converter includes a sensing oscillator including a plurality of tri-state buffers configured to generate a sensing clock period signal corresponding to a change value of at least one of a resistive sensor and a capacitive sensor, a reference oscillator configured to generate a predetermined fixed clock period signal, a processor configured to change a connection state of the plurality of tri-state buffers, a frequency divider configured to scale up the generated sensing clock period signal based on a predetermined value; and a counter configured to count the scaled up sensing clock period signal based on the generated fixed clock cycle signal and output a counted digital value.

8 Claims, 15 Drawing Sheets

(51) Int. Cl.
    *G01L 1/14*     (2006.01)
    *G01N 27/22*     (2006.01)
    *G06F 3/045*     (2006.01)

(58) Field of Classification Search
    CPC .. G01K 7/24; G01K 7/25; G01K 7/32; G01K 7/34; G01L 1/142; G01L 1/144; G01N 27/223; G06F 3/045
    See application file for complete search history.

(56) References Cited

U.S. PATENT DOCUMENTS

| | | |
|---|---|---|
| 2015/0002216 A1 | 1/2015 | Jeon |
| 2018/0351508 A1* | 12/2018 | Hwang ................ H03K 3/0315 |

FOREIGN PATENT DOCUMENTS

| | | |
|---|---|---|
| KR | 20160046696 | 4/2016 |
| KR | 20170123968 | 11/2017 |
| KR | 20180001983 | 1/2018 |
| KR | 101931445 | 12/2018 |

OTHER PUBLICATIONS

Korean Office Action dated Apr. 18, 2019 for corresponding Korean Patent Application No. 10-2018-0054067, with English translation, 9 pages.

Korean Notice of Allowance dated Aug. 17, 2019 for corresponding Korean Patent Application No. 10-2018-0054067, with English translation, 6 pages.

\* cited by examiner

RECONFIGURABLE DIGITAL CONVERTER FOR CONVERTING SENSING SIGNAL OF PLURALITY OF SENSORS INTO DIGITAL VALUE

CROSS-REFERENCE TO RELATED APPLICATION

This application is based on and claims priority under 35 U.S.C. § 119 to Korean Patent Application No. 10-2018-0054067, filed on May 11, 2018, in the Korean Intellectual Property Office, and the disclosure of which is herein incorporated by reference in its entirety.

BACKGROUND

1. Field

The disclosure relates to a digital converter and a control method thereof, and more particularly, to a reconfigurable digital converter and a control method for converting a sensing signal of a plurality of sensors into a digital value.

2. Description of Related Art

Recently, there is a growing interest in an inter-device network called the Internet-of-Things (IoT). The IoT may generate innovation in manufacturing, energy management, health care, urban development, or the like. A system (or apparatus) belonging to the IoT should sense various environmental variables such as temperature, pressure, humidity, or the like. Sensing of the environmental variables of the IoT system may be performed by measuring changes in parameters such as resistance of a resistive sensor or capacitance of a capacitive sensor.

In the related art, an individual resistance digital converter (RDC) or a capacitance digital converter (CDC) is used to read out resistance or capacitance. For example, as illustrated in FIG. 1, the IoT system may include a plurality of resistive sensors for temperature sensing or touch sensing, and a plurality of capacitive sensors for sensing humidity, motion, or pressure. Therefore, the IoT system may include a plurality of RDCs for processing a sensing signal of a plurality of resistive sensors and a plurality of CDCs for processing a sensing signal of a plurality of capacitive sensors.

The related art to use an individual sensor front-end for each sensor has a drawback in that the overall size is increased, a large amount of power is consumed, and thus is costly. The input range of the related art is limited and thus, use for a wide range of application fields in which a sensor nominal value may significantly vary is limited. In addition, the related art has a limitation in accurate and precise sensing of various environmental variable signals through sensors having various sensitivity due to low resolution. In addition, the related art does not have a solution to the problem of parasitic capacitance influencing the sensing accuracy of a typical capacitive sensor.

Thus, there is a need for a technology to process a sensing signal for a plurality of resistive sensors and capacitive sensors in one converter.

SUMMARY

Aspects of the disclosure are to address at least the above-mentioned problems and/or disadvantages and to provide at least the advantages described below. Accordingly, an aspect of the disclosure is to provide a digital converter which processes all the sensing signals of a plurality of resistive sensors and capacitive sensors and a controlling method thereof.

According to an embodiment, a digital converter includes a sensing oscillator including a plurality of tri-state buffers configured to generate a sensing clock period signal corresponding to a change value of at least one of a resistive sensor and a capacitive sensor, a reference oscillator configured to generate a predetermined fixed clock period signal, a processor configured to change a connection state of the plurality of tri-state buffers, a frequency divider configured to scale up the generated sensing clock period signal based on a predetermined value; and a counter configured to count the scaled up sensing clock period signal based on the generated fixed clock cycle signal and output a counted digital value.

The reference oscillator may include a first inverse voltage controller, a second inverse voltage controller, a first tri-state buffer, and a second tri-state buffer, and an output terminal of the first tri-state buffer is connected to an end of a first zero temperature coefficient resistor that is robust to temperature change, and an output terminal of the second tri-state buffer is connected to an end of a first reference capacitor, an input terminal of the first inverse voltage controller is connected to another end of the first zero temperature coefficient resistor and another end of the first reference capacitor, the output terminal of the first inverse voltage controller is connected to an input terminal of the second tri-state buffer and an input terminal of the second inverse voltage controller, and an output terminal of the second inverse voltage controller is connected to an input terminal of the first tri-state buffer, and the predetermined fixed clock period signal which is proportional to a resistance value of the first zero temperature coefficient resistor and a capacitance value of the first reference capacitor is outputted.

The sensing oscillator may include a third inverse voltage controller and a fourth inverse voltage controller, the plurality of tri-state buffers may include a third tri-state buffer, a fourth tri-state buffer, and at least one $n^{th}$ tri-state buffer, an output terminal of the third tri-state buffer may be connected to an end of a second zero temperature coefficient resistor which is robust to temperature change, and an output terminal of the fourth tri-state buffer is connected to an end of a second reference capacitor, an input terminal of the third inverse voltage controller may be connected to another end of the second zero temperature coefficient resistor and another end of the second reference capacitor, an output terminal of the third inverse voltage controller may be connected to an input terminal of the fourth tri-state buffer, an input terminal of at least one $n^{th}$ tri-state buffer, and an input terminal of the fourth inverse voltage controller, and an output terminal of the fourth inverse voltage controller may be connected to an input terminal of the third tri-state buffer and an input terminal of at least one $n^{th}$ tri-state buffer which is connected to the resistive sensor, and the sensing clock period signal is outputted.

The first zero temperature coefficient resistor and the second zero temperature coefficient resistor may have a same resistance value, and the first reference capacitor and the second reference capacitor may have a same capacitance value.

When the resistive sensor is connected to the digital converter, both ends of a sensing resistor included in the resistive sensor may be connected to the third inverse voltage controller and the $n^{th}$ tri-state buffer which is connected to the resistive sensor, respectively, and the processor may turn on the fourth tri-state buffer and the $n^{th}$ tri-state buffer which is connected to the resistive sensor.

The sensing clock period signal may be proportional to a resistance value of the sensing resistor and the capacitance value of the second reference capacitor, and the counter may output a digital value in which the resistance value of the sensing resistor is counted based on the resistance value of the first zero temperature coefficient resistor.

When the capacitive sensor is connected to the digital converter, both ends of a sensing capacitor included in the capacitive sensor may be connected to the third inverse voltage controller and $n^{th}$ tri-state buffer which is connected to the capacitive sensor, respectively, and the processor may turn on the third tri-state buffer and the $n^{th}$ tri-state buffer which is connected to the capacitive sensor.

The sensing clock period signal may be proportional to a resistance value of the second zero temperature coefficient resistor and the capacitance value of the sensing capacitor, and the counter may output a digital value in which the capacitance value of the sensing capacity is counted based on the capacitance value of the first reference capacitor.

When the capacitive sensor is connected to the digital converter and includes a parasitic capacitance, the sensing oscillator may connect an end and another end of a sensing capacitor included in the capacitive sensor respectively to an output terminal of the $n^{th}$ tri-state buffer connected to the capacitive sensor and an input terminal of the third inverse voltage controller, the counter may count up the sensing clock period signal which is proportional to an accumulated value of a capacitance value of the second reference capacitor, a capacitance value of the sensing capacitor, and a capacitance value of the parasitic capacitance for a first time, counts down the sensing clock period signal which is proportional to an accumulated value of a capacitance value of the second reference capacitor and a capacitance value of the parasitic capacitor for a second time, after the first time, and the processor may turn on the third tri-state buffer, a fourth tri-state buffer, and the $n^{th}$ tri-state buffer connected to the capacitive sensor for the first time, turns off the $n^{th}$ tri-state buffer connected to the capacitive sensor after the first time, calculate a difference value of a count-up value calculated by the count-up and a count-down value calculated by the count-down, and control the counter to output the calculated difference value into a digital value.

According to an embodiment, a controlling method of a digital converter includes changing a connection state of a plurality of tri-state buffers included in a sensing oscillator; generating a sensing clock period signal corresponding to a change value of at least one of a resistive sensor and a capacitive sensor and a predetermined fixed clock period signal; scaling up the generated sensing clock period signal based on a predetermined value; and counting the scaled-up sensing clock period signal based on the generated fixed clock period signal and outputting a counted digital value.

As described above, according to various embodiments of the disclosure, a reconfigurable digital converter for converting a sensing signal of a plurality of sensors into a digital value may interface a sensing signal of various types of resistive sensors and capacitive sensors using the same front end through reconfigurability.

The reconfigurable digital converter for converting a sensing signal of a plurality of sensors into a digital value may connect several sensors without unnecessary power consumption, since all current of the system flows dynamically.

In addition, the reconfigurable digital converter for converting a sensing signal of a plurality of sensors into a digital value may process a sensing signal accurately regardless of the parasitic capacitance even for a capacitive sensor having a small value.

Also, the reconfigurable digital converter for converting a sensing signal of a plurality of sensors into a digital value may reduce temperature dependence by using a zero temperature coefficient resistor which is robust to temperature changes and a ratiometric transfer function.

The reconfigurable digital converter for converting a sensing signal of a plurality of sensors into a digital value may be applied to various sensors having a wide range of values and read out a plurality of sensor values through a time crossing method.

The reconfigurable digital converter for converting a sensing signal of a plurality of sensors into a digital value may reduce the total size and power consumption, thereby saving costs.

BRIEF DESCRIPTION OF THE DRAWINGS

The above and other aspects, and advantages of certain embodiments of the disclosure will be more apparent from the following description taken in conjunction with the accompanying drawings, in which:

FIGS. 13A to 14D are views illustrating an experiment result of a digital converter according to an embodiment.

The same reference numerals are used to represent the same elements throughout the drawings.

DETAILED DESCRIPTION

Figure 1:
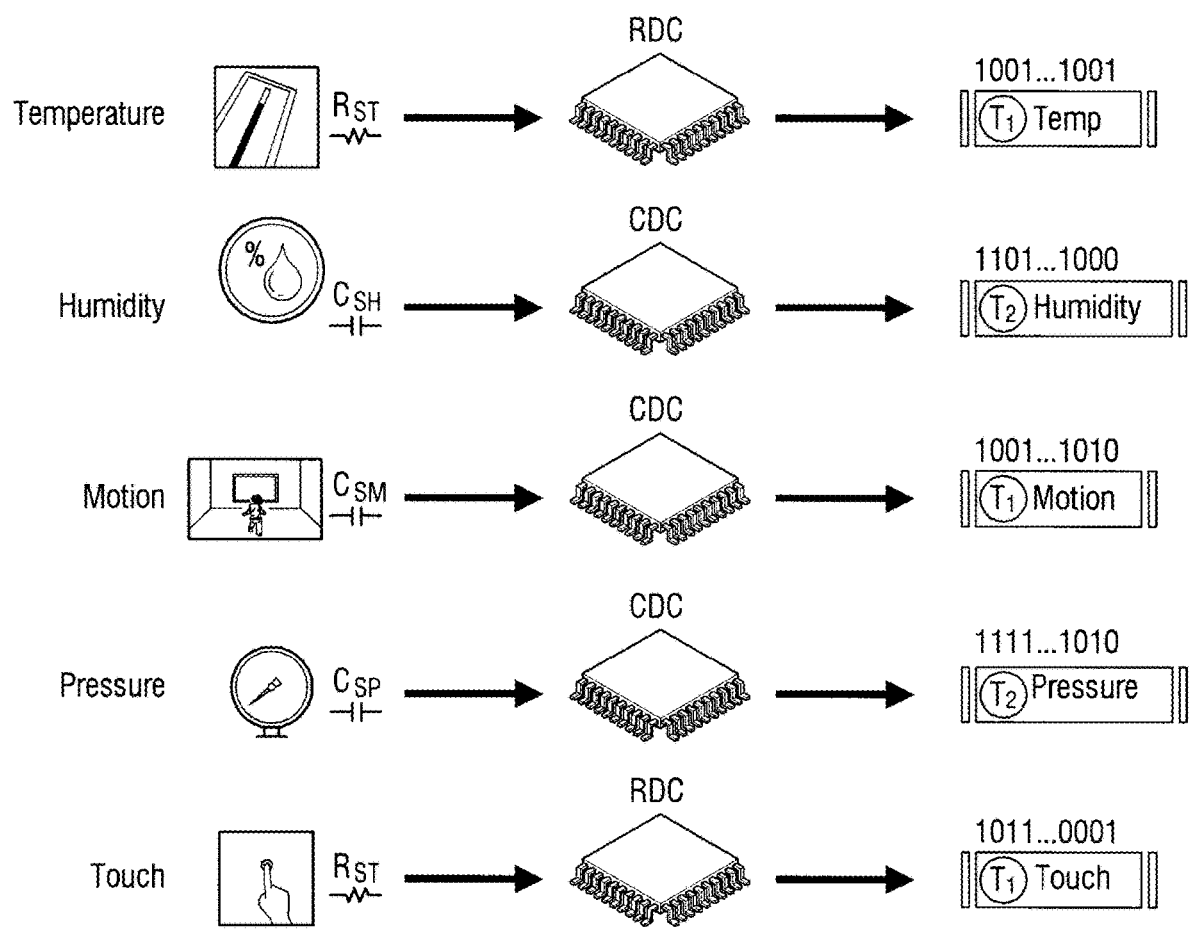
FIG. 1 is a view illustrating a conventional method for processing a sensing signal of a plurality of sensors.

Hereinafter, embodiments of the disclosure will be described with reference to the accompanying drawings. However, it may be understood that the disclosure is not limited to the embodiments described hereinafter, but includes various modifications, equivalents, and/or alternatives of the embodiments of the disclosure. In relation to explanation of the drawings, similar drawing reference numerals may be used for similar constituent elements.

In the description, the terms "first, second, and so forth" are used to describe diverse elements regardless of their order and/or importance and to discriminate one element from other elements, but are not limited to the corresponding elements.

In this disclosure, the terms "comprises" or "having" and the like are used to specify that there is a feature, number, step, operation, element, part or combination thereof described in the specification, but do not preclude the presence or addition of one or more other features, numbers, steps, operations, elements, parts, or combinations thereof. It is to be understood that when an element is referred to as being "coupled" or "connected" to another element, it may be directly coupled or connected to the other element, or any other element may be interposed therebetween. In the meantime, when an element is referred to as being "directly coupled" or "directly connected" to another element, it should be understood that no other element is present therebetween.

In the disclosure, a "module" or a "~er/~or" may perform at least one function or operation, and be implemented by hardware or software or be implemented by a combination of hardware and software. In addition, a plurality of "modules" or a plurality of "~ers/~ors" may be integrated in at least one module and be implemented by at least one processor (not illustrated) except for a "module" or a "~er/or" that needs to be implemented by specific hardware. Singular forms are intended to include plural forms unless the context clearly indicates otherwise.

When it is decided that a detailed description for the known art related to the disclosure may unnecessarily obscure the gist of the disclosure, the detailed description will be reduced or omitted.

Figure 2:
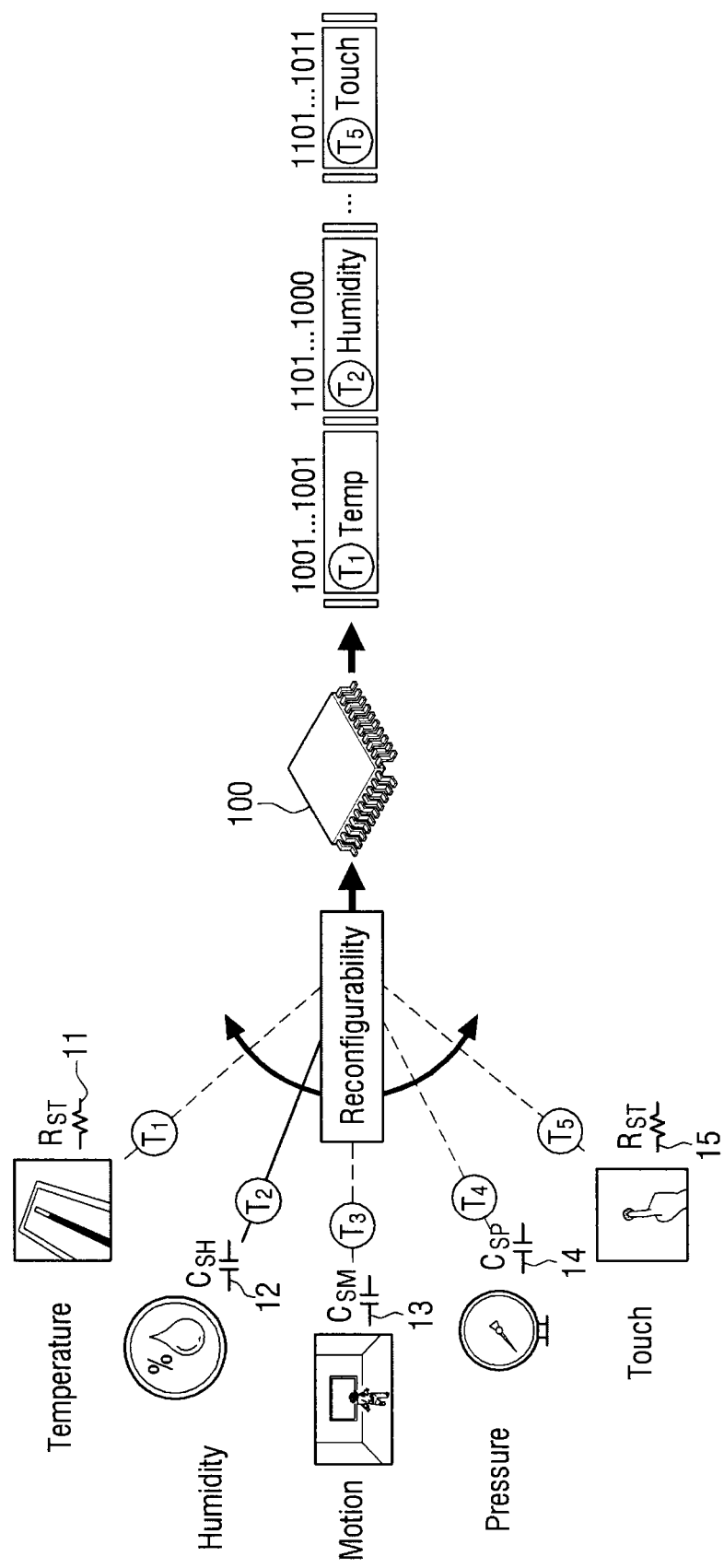
FIG. 2 is a view illustrating a method for processing a sensing signal of a plurality of sensors according to an embodiment of the disclosure.

FIG. 2 is a view illustrating a method for processing a sensing signal of a plurality of sensors according to an embodiment of the disclosure.

Referring to FIG. 2, a plurality of sensors are described. For example, the plurality of sensors 11, 12, 13, 14, and 15 may include a temperature sensor, a humidity sensor, a motion sensor, a pressure sensor, a touch sensor, or the like. The plurality of sensors 11, 12, 13, 14, and 15 may be resistive sensors or capacitive sensors. A resistive sensor means a sensor including a sensing resistance and of which a sensing resistance value is changed according to a change in the surrounding environment. The capacitive sensor means a sensor which includes a sensing capacitor and of which sensing capacitor value is changed according to a change in the surrounding environment. In one embodiment, the temperature sensor and the touch sensor may be resistive sensors, and the humidity sensor, motion sensor, and pressure sensor may be capacitive sensors. The type and sensing method of the sensors as described above are one embodiment, and there may be various types and sensing methods of sensors.

The signal sensed by the sensor may be processed and outputted by a digital converter 100. In the case of the related art, an individual digital converter is required according to a sensing method of a sensor. However, the digital converter 100 of the disclosure may process signals sensed by several types of sensors using one front end module.

The digital converter 100 according to the disclosure includes a tri-state buffer, activates (turns on) some tri-state buffers according to the connection of the resistive sensor or capacitive sensor, and deactivates (turns off) some tri-state buffers. The digital converter 100 generates a fixed clock period signal and a sensing clock period signal based on the connected sensor. The digital converter 100 outputs a digital sensing value corresponding to the sensor types by outputting the sensing clock period signal into a digital value based on the generated fixed clock period signal. Even if various types of sensors are connected, the digital converter 100 may output a corresponding digital sensing value, and even when a plurality of sensors are connected, a digital sensing value corresponding to each sensor may be outputted. For example, when one type of sensor is connected to the digital converter 100, the digital converter 100 may continuously output the digital sensing value corresponding to the sensing signal of the connected sensor. In addition, when a plurality of sensors are connected to the digital converter 100, the digital converter 100 may sequentially output digital sensing values of a predetermined size corresponding to the sensing signals of the respective sensors in accordance with time. Therefore, the digital converter 100 of the disclosure may have reconfigurability. In other words, the digital converter 100 may output the digital sensing value corresponding to the sensors regardless of the sensing method of the connected sensor. In the meantime, depending on the types of sensors, the resistance value and the capacitor value may have various values. For example, a resistive sensor may have a resistance value in k$\Omega$ units and a resistance value in M$\Omega$ units, in accordance with types of the sensors. In addition, the capacitive sensor may have a capacitance value in units of pF according to types of the sensor, and may have a capacitance value in units of fF. The digital converter 100 may output a digital sensing value corresponding to the sensor regardless of the sensing resistance of the connected sensor or the nominal value of the sensing capacitor. The digital converter 100 may have a wide resistance input range or a wide capacitance input range.

The digital converter 100 may maximize the resolution by improving the phase noise performance through swing boosting. In addition, when the sensing capacitor has a small capacitance value of fF unit, a general digital converter may be influenced by a relatively large parasitic capacitor, compared to a sensing capacitor. However, the digital converter 100 of the disclosure may output a digital sensing value with little influence of the parasitic capacitor by using a unique signal processing method.

Hereinafter, a specific configuration and operation of the digital converter 100 of the disclosure will be described.

Figure 3:
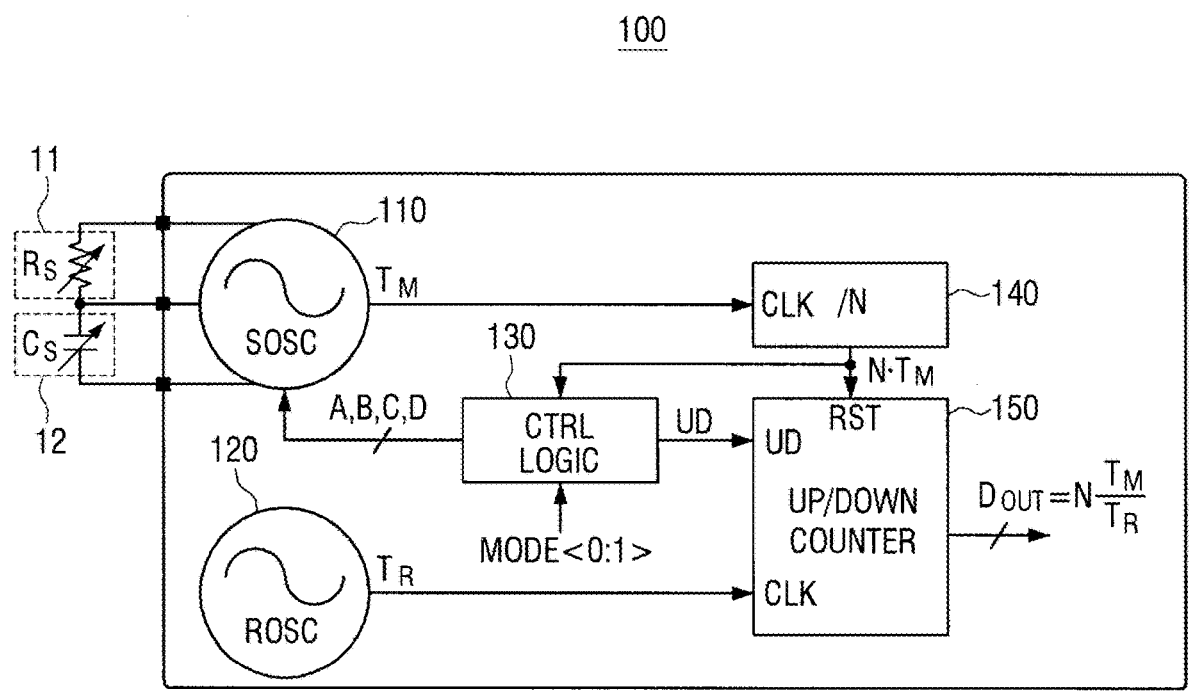
FIG. 3 is a block diagram of a digital converter according to an embodiment.

FIG. 3 is a block diagram of the digital converter according to an embodiment of the disclosure. Referring to FIG. 3, the digital converter 100 includes a sensing oscillator 110, a reference oscillator 120, a processor 130, a frequency divider 140, and a counter 150.

The sensing oscillator 110 includes a plurality of tri-state buffers. The plurality of tri-state buffers may include a tri-state buffer connected to a zero temperature-coefficient (TC) resistor which is robust to a change in temperature and a tri-state buffer connected to the reference capacitor. The plurality of tri-state buffers may include at least one of a tri-state buffer connected to a resistive sensor 11 and a tri-state buffer connected to a capacitive sensor 12. Specifically, one tri-state buffer may be connected to a sensing resistance included in the resistive sensor 11, and the other tri-state buffer may be connected to a sensing capacitor included in the capacitive sensor 12. The digital converter 100 may include a plurality of tri-state buffers connected to each of the resistive sensors 11 and a plurality of tri-state buffers connected to each of the capacitive sensors 12. The sensing oscillator 110, when connected to at least one of the resistive sensor 11 and the capacitive sensor 12, generates a sensing clock period signal $T_M$ corresponding to a change value of the sensor based on the connected sensor. The generated sensing clock period signal $T_M$ is transmitted to the frequency divider 140. The structure and operation of the sensing oscillator 110 will be described in detail below.

The reference oscillator 120 generates a preset fixed clock period signal $T_R$. The reference oscillator 120 may be similar to the structure of the sensing oscillator 110. In other words, the reference oscillator 120, also, may include a tri-state buffer connected to a zero temperature coefficient resistor which is robust to a temperature change, and a tri-state buffer connected to the reference capacitor. The reference oscillator 120 generates a predetermined fixed clock period signal $T_R$ which is proportional to the value of the zero temperature coefficient resistor and the value of the reference capacitor. The generated predetermined fixed clock period signal $T_R$ is transmitted to the counter 150. The structure and operation of the reference oscillator 120 will be described in detail below.

The processor 130 activates or deactivates the plurality of tri-state buffers included in the sensing oscillator 110 according to the types and numbers of the connected sensors. For example, when the resistive sensor 11 is connected to the digital converter 100, the processor 130 may activate the tri-state buffer connected to the sensing resistance of the resistive sensor 11 and the tri-state buffer connected to the reference capacitor, and deactivate another tri-state buffer. Alternatively, when the capacitive sensor 12 is connected to the digital converter 100, the processor 130 may activate a tri-state buffer connected to the sensing capacitor of the capacitive sensor 12 and a tri-state buffer connected to the zero temperature coefficient resistor, and deactivate another tri-state buffer.

Alternatively, when the resistive sensor 11 and the capacitive sensor 12 are respectively connected to the digital converter 100, the processor 130 activates the tri-state buffer connected to the sensing resistance of the resistive sensor 11 and the tri-state buffer connected to the reference capacitor first, and deactivates another tri-state buffer for a predetermined time. Then, the processor 130 may activate the tri-state buffer connected to the sensing capacitor of the capacitive sensor 12 and the tri-state buffer connected to the zero temperature coefficient resistor for a predetermined time, and deactivate another tri-state buffer. In other words, when the resistive sensor 11 and the capacitive sensor 12 are respectively connected to the digital converter 100, the processor 130 may control the sensing oscillator 110 to repeatedly perform the processing of the sensing signal of the resistive sensor 11 and the processing of the sensing signal of the capacitive sensor 12 alternately, with a predetermined cycle. The plurality of tri-state buffers included in the sensing oscillator 110 may consume power only when the plurality of tri-state buffers are activated. Accordingly, the digital converter 100 may consume less power, even if various types of sensors are connected to process sensing signals of various types of sensors.

The frequency divider 140 scales up the generated sensing clock period signal $T_M$ based on a predetermined value. The frequency divider 140 may divide the input clock frequency. The clock frequency is inversely proportional to the clock period. Thus, if the frequency divider 140 divides the input clock frequency, the clock period is scaled up. The scaled-up sensing clock period signal $N \cdot T_M$ is transmitted to the counter 150.

The counter 150 receives the fixed clock period signal $T_R$ from the reference oscillator 120, and receives the scaled-up sensing clock period signal $N \cdot T_M$ from the frequency divider 140. The counter 150 counts the sensing clock period signal $N \cdot T_M$ which is scaled up with respect to the fixed clock period signal $T_R$ according to the control of the processor 130 and outputs the counted signal into a digital value. For example, the counter 150 may count-up the number of rising edges of the fixed clock period signal $T_R$ included in the scaled-up sensing clock period signal $N \cdot T_M$ in a state where the scaled-up sensing clock period signal $N \cdot T_M$ is 1, and output a count-up value which is calculated by the count-up.

The sensing clock period signal $T_M$ is determined according to the value of the resistance included in the resistive sensor 11 or the value of the capacitor included in the capacitive sensor 12 which may vary depending on the surrounding environment. Accordingly, the sensing clock period signal $N \cdot T_M$ scaled up by the frequency divider 140 may vary, or the digital value counted by the counter 150 may vary. That is, the digital converter 100 may output a digital sensing value which may vary in accordance with the sensing signal of the resistive sensor 11 or the capacitive sensor 12, which varies depending on the surrounding environment.

Figure 4A:
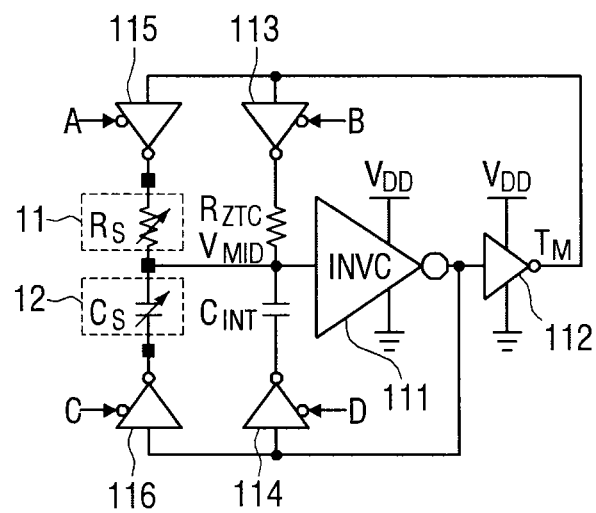
FIGS. 4A and 4B are views to describe a sensing oscillator according to an embodiment.
Figure 4B:
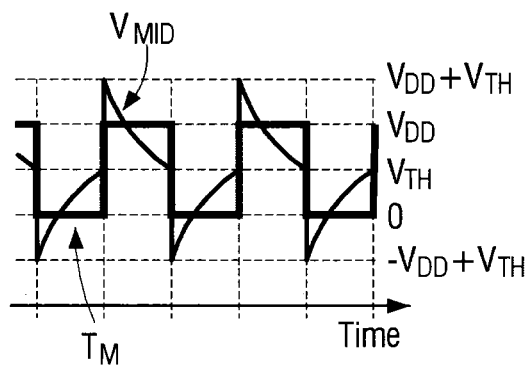

FIGS. 4A and 4B are views to describe a sensing oscillator according to an embodiment.

Referring to FIG. 4A, the structure of the sensing oscillator 110 according to one embodiment is illustrated. The sensing oscillator 110 may include a plurality of tri-state buffers 113, 114, 115, and 116 and two inverse voltage controllers 111 and 112. For convenience of description, a tri-state buffer 113 connected to the reference resistance among a plurality of tri-state buffers 113, 114, 115, and 116 is referred to as a third tri-state buffer, a tri-state buffer 114 connected to the reference capacitor $C_{INT}$ is referred to as a fourth tri-state buffer, and at least one tri-state buffer 115 which is respectively connected to at least one resistive sensor 11 and at least one tri-state buffer 116 respectively connected to at least one capacitive sensor 12 is referred to as an $n^{th}$ tri-state buffer. That is, the digital converter may be connected to the resistive sensor or the capacitive sensor as much as the number of the $n^{th}$ tri-state buffers included in the sensing oscillator 110. In addition, the two inverse voltage controllers 111 and 112 are referred to as a third inverse voltage controller and a fourth inverse voltage controller, respectively.

As described above, the output of the third tri-state buffer 113 may be connected to one end of the reference resistance, and the output of the fourth tri-state buffer 114 may be connected to one end of the reference capacitor $C_{INT}$. The reference resistance may be zero temperature coefficient $R_{ZTC}$ resistance robust to temperature change.

In general, a value of resistance may vary according to temperature. However, the reference resistance is required to maintain a constant value, without being influenced by temperature. Therefore, the reference resistance may be a zero temperature coefficient resistor $R_{ZTC}$ independent of the temperature. The $R_{ZTC}$ may be made based on a resistance $R_P$ (first resistance) having a temperature coefficient greater than a desired temperature coefficient and a resistance ($R_N$) (second resistance) having a temperature coefficient smaller than a desired temperature coefficient. That is, the $R_{ZTC}$ may be made by composing a first group by connecting the first resistance $R_P$ and the second resistance $R_N$ through series connection, making a second group by connecting the third resistance and the fourth resistance through parallel connection, and then connecting the first group and the second group through series connection. In the meantime, the resistance value of the third resistor and the fourth resistor of the second group may be a value which is obtained by multiplying predetermined values based on the resistance ratio $R_{P0}$ of the first resistance and the resistance ratio $R_{N0}$ of the second resistance. The resistance ratio of the second resistance $R_{N0}$ to the resistance ratio $R_{P0}$ of the first resistance may be represented as βs (βs=$R_{N0}/R_{P0}$), and k=(1+βs)$^2$. The resistance value of the third resistance of the second group may be K $R_P$, and the resistance value of the fourth resistance may be K/(βs)$^2$·$R_N$. The third resistance and the fourth resistance may be made to have a resistance value that is set based on the length and width of the resistance. The $R_{ZTC}$ may obtain a temperature coefficient change compensation effect of a process by connecting, through series connection, the first group which includes two resistances connected through series connection and the second group including two resistances connected through parallel connection. That is, the $R_{ZTC}$ has little change in the resistance value according to temperature. The $R_{ZTC}$ has been described in detail in a previously filed application specification (Korean Patent Application No. 10-2017-0123968).

The input terminal of the third inverse voltage controller 111 may be connected to another end of the $R_{ZTC}$ and another end of the $C_{INT}$, and the output terminal of the third inverse voltage controller 111 may be connected to the input terminal of the fourth tri-state buffer 114, the input terminal of the n$^{th}$ hi-state buffer 116 connected to the capacitive sensor and the input terminal of the fourth inverse voltage controller 112.

The output terminal of the fourth inverse voltage controller 112 may be connected to the input terminal of the third tri-state buffer 113 and the input terminal of the n$^{th}$ tri-state buffer 115 connected to the resistive sensor, and output the sensing clock period signal $T_M$ based on the connected resistive sensor or capacitive sensor.

Referring to FIG. 4B, a waveform of the sensing oscillator is illustrated. According to an embodiment, when the capacitive sensor 12 is connected to the digital converter (C-mode), the third tri-state buffer 113 and the n$^{th}$ tri-state buffer 116 connected to the capacitive sensor may be activated by the control of the processor, and remaining tri-state buffers 114 and 115 may be deactivated. When the sensing clock period signal $T_M$ is low, the voltage of the output terminal of the third tri-state buffer 113 may be $V_{DD}$, and the voltage of the output terminal of the n$^{th}$ tri-state buffer 116 connected to the capacitive sensor may be GND. The sensing capacitor $C_S$ included in the capacitive sensor 12 may be charged through the $R_{ZTC}$. When the input voltage $V_{MID}$ of the third inverse voltage controller 111 becomes a threshold $V_{TH}$ of the third inverse voltage controller 111, the sensing clock period signal $T_M$ becomes high, and the voltage of the output terminal of the third tri-state buffer 113 may be GND, and the voltage of the output terminal of the n$^{th}$ tri-state buffer 116 connected to the capacitive sensor may be $V_{DD}$. At this time, the input voltage $V_{MID}$ of the third inverse voltage controller 111 may jump to $V_{DD}+V_{TH}$, and the $C_S$ may be discharged to GND through the $R_{ZTC}$. When the input voltage $V_{MID}$ of the third inverse voltage controller 111 becomes the threshold $V_{TH}$ of the third inverse voltage controller 111 again, the sensing clock period signal $T_M$ becomes low, and the voltage of the output terminal of the third tri-state buffer 113 may become $V_{DD}$, and the voltage of the output terminal of the n$^{th}$ tri-state buffer 116 connected to the capacitive sensor may be GND. At this time, the input voltage $V_{MID}$ of the third inverse voltage controller 111 may be $-V_{DD}+V_{TH}$, and the $C_S$ may be charged through the $R_{ZTC}$. Consequently, the input voltage $V_{DD}$ of the third inverse voltage controller 111 may have swing of 2·$V_{DD}$, and the digital converter may make the sensing clock period $T_M$ of TM≈2·$R_{ZTC}$·$C_S$·ln(3) which is proportional to the value of $C_S$. The large swing may maximize the slope of the input voltage $V_{MID}$ of the third inverse voltage controller 111 across $V_{TH}$. In addition, the change in the period due to 1/f noise and the offset of the third inverse voltage controller 111 may be inherently cancelled as they affect the charging and discharging regions of the time waveform in an opposite manner. As a result, the phase-noise performance of the oscillator may get closer to the theoretically obtainable maximum performance of 169 dBc/Hz at both close-in and far-off offsets. This may maximize the sensing resolution of the digital converter, which is primarily determined by the jitter accumulated in the time window N·$T_M$.

When the resistive sensor 11 is connected to the digital converter (R mode), the digital converter may perform operations which are similar to the aforementioned operations except that the fourth tri-state buffer 114 and the n$^{th}$ tri-state buffer 115 connected to the resistive sensor may be activated, the remaining tri-state buffers 113 and 116 may be deactivated, and the sensing clock period $T_M$ of $T_M$≈2·$R_S$·$C_{INT}$·ln(3) which is in proportion to the sensing resistor $R_S$ value included in the resistive sensor 11 may be made.

Figure 5:
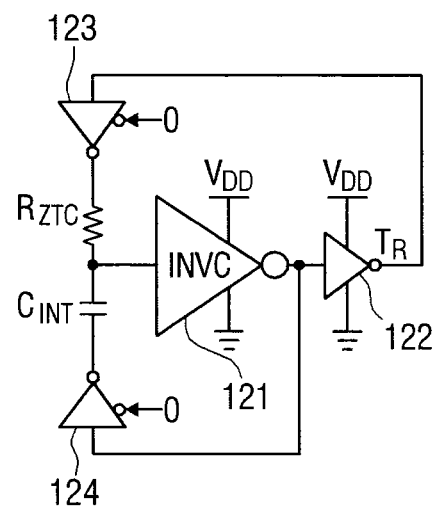
FIG. 5 is a view illustrating a reference oscillator according to an embodiment.

FIG. 5 is a view illustrating a reference oscillator according to an embodiment.

Referring to FIG. 5, the structure of a reference oscillator 120 according to one embodiment is illustrated. The reference oscillator 120 may include a plurality of tri-state buffers 123 and 124, and two inverse voltage controllers 121 and 122. For convenient description, the tri-state buffer 123 connected to the reference resistance among the plurality of tri-state buffers 123 and 124 is referred to as the first tri-state buffer and the tri-state buffer 124 connected to the $C_{INT}$ is referred to as the second tri-state buffer. In addition, the two inverse voltage controllers 121 and 122 are referred to as the first inverse voltage controller and the second inverse voltage controller, respectively.

As described above, the output terminal of the first tri-state buffer 123 may be connected to one end of the reference resistance, and the output terminal of the second tri-state buffer 124 may be connected to one end of the $C_{INT}$. The reference resistance may be the $R_{ZTC}$ resister which is robust to the temperature change.

The input terminal of the first inverse voltage controller 121 may be connected to the other terminal of the $R_{ZTC}$ and the other terminal of the $C_{INT}$, and the output terminal of the first inverse voltage controller 121 may be connected to the input terminal of the second tri-state buffer 124 and the input terminal of the second inverse voltage controller 122. The output terminal of the second inverse voltage controller 122 may be connected to the input terminal of the first tri-state buffer 123 output the predetermined fixed clock period signal which is proportional to the value of the $R_{ZTC}$ and the value of the $C_{INT}$. That is, the reference oscillator 120 may generate a signal having a fixed period of $T_R$≈2·$R_{ZTC}$·$C_{INT}$·ln (3). As described above, the $R_{ZTC}$ may be a resistance having a temperature coefficient close to zero that is fabricated in series and in parallel combination of on-chip resistors having appropriately weighted negative and positive temperature coefficients TC, and the $C_{INT}$ may be an on-chip capacitor. The reference oscillator 120 performs similar operations as the sensing oscillator 110 except that the first and second tri-state buffers are always activated and a fixed period signal of $T_R$≈2·$R_{ZTC}$·$C_{INT}$·ln(3) is generated.

The zero temperature coefficient resistance included in the reference oscillator 120 and the zero temperature coefficient resistance included in the sensing oscillator 110 may have the same resistance value, and the reference capacitor included in the reference oscillator 120 and the reference capacitor included in the sensing oscillator 110 may have the same capacitance value. Hereinafter, each mode of the digital converter will be described.

Figure 6:
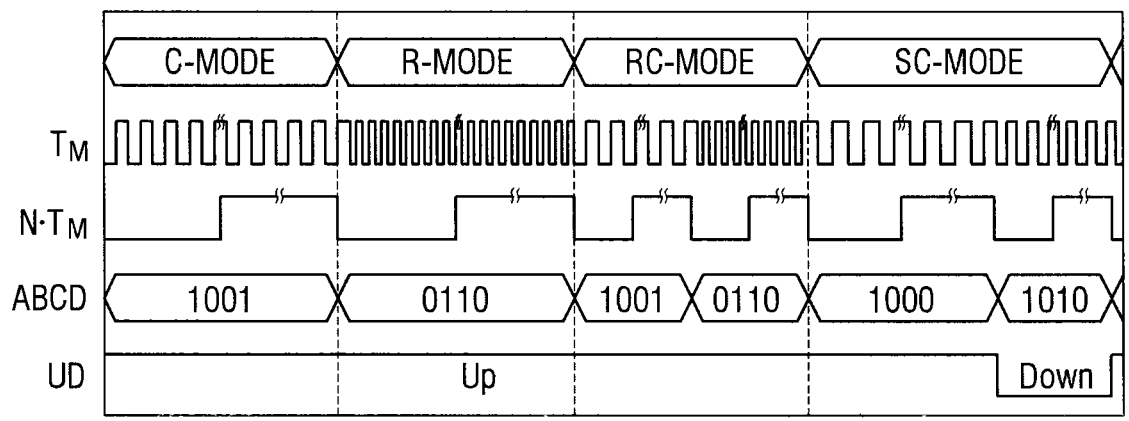
FIG. 6 is a view illustrating various operation modes according to an embodiment.

FIG. 6 is a view illustrating various operation modes according to an embodiment.

Referring to FIG. 6, a timing diagram in various modes of the digital converter is illustrated.

First of all, the C-mode means a mode in which the capacitive sensor is connected to the digital converter. When the capacitive sensor is connected to the digital converter, the processor may activate the third tri-state buffer 113 and the n$^{th}$ tri-state buffer 116 connected to the capacitive sensor of the sensing oscillator, and deactivate remaining tri-state buffers. The tri-state buffer is operative by the inverse input and thus, the control input signal for the n$^{th}$ tri-state buffer 115 connected to the resistive sensor, the third tri-state buffer 113, the n$^{th}$ tri-state buffer 116 connected to the capacitive sensor, and the fourth tri-state buffer 114 connected to the sensing oscillator may be 1001. The sensing oscillator may generate the sensing clock period signal $T_M$ and the frequency divider which receives the sensing clock period signal $T_M$ may generate the scaled-up sensing clock period signal $N \cdot T_M$. The counter, according to the up-count control signal of the processor, may output a sensing value based on the predetermined clock period signal $T_R$ and the scaled-up sensing clock period signal $N \cdot T_M$.

R-mode means a mode in which the resistive sensor is connected to the digital converter. When the resistive sensor is connected to the digital converter, the processor activates the fourth tri-state buffer 114 and the n$^{th}$ tri-state buffer 115 connected to the resistive sensor of the sensing oscillator, and deactivate remaining tri-state buffers. Therefore, the control input signal for the n$^{th}$ tri-state buffer 115 connected to the resistive sensor, the third tri-state buffer 113, the n$^{th}$ tri-state buffer 116 connected to the capacitive sensor, and the fourth tri-state buffer 114 connected to the sensing oscillator may be 0110. The sensing oscillator may generate the sensing clock period signal $T_M$ and the frequency divider which receives the sensing clock period signal $T_M$ may generate the scaled-up sensing clock period signal $N \cdot T_M$. The counter, according to the up-count control signal of the processor, may output a sensing value based on the predetermined clock period signal $T_R$ and the scaled-up sensing clock period signal $N \cdot T_M$.

The RC-mode means a mode in which the resistive sensor and the capacitive sensor are connected to the digital converter. The basic operations are the same as the operations of the C-mode and the R-mode. In the meantime, the digital converter may sequentially repeat the operations of the C-mode and the R-mode in an alternate manner with a cycle.

The SC-mode is a mode for reading out a small capacitive sensor value while eliminating the influence of a parasitic capacitor when the capacitance value of the capacitive sensor is small and influenced by a parasitic capacitor caused by a plurality of capacitive sensors. The specific operation of the SC-mode will be described later.

Figure 7A:
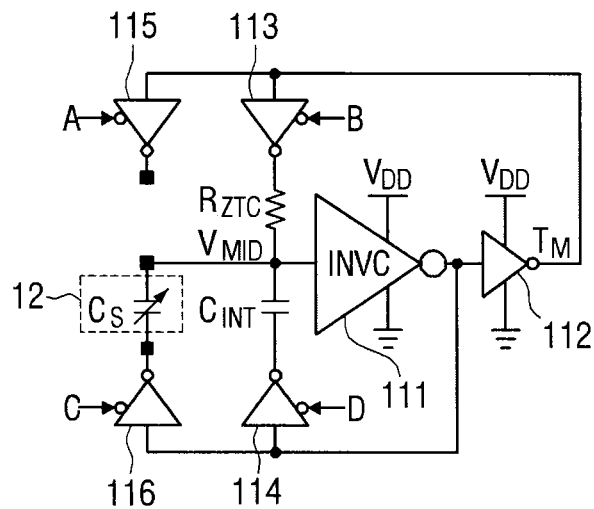
FIGS. 7A and 7B are views illustrating an embodiment in which a capacitive sensor is connected.
Figure 7B:
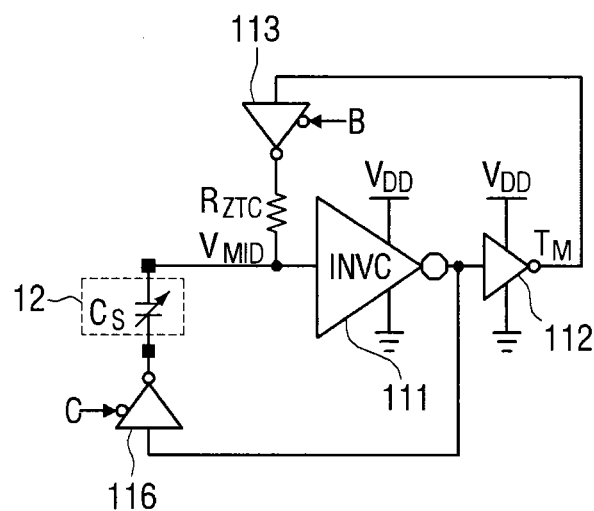

FIGS. 7A and 7B are views illustrating an embodiment in which a capacitive sensor is connected.

Referring to FIG. 7A, the sensing oscillator connected to the capacitive sensor 12 is illustrated. As described above, the $C_S$ of the capacitive sensor 12 may be connected to the n$^{th}$ tri-state buffer 116 connected to the capacitive sensor of the sensing oscillator. That is, one end and the other end of the $C_S$ may be connected to the output terminal of the n$^{th}$ tri-state buffer 116 connected to the capacitive sensor and the input terminal of the third inverse voltage controller 111, respectively.

When the capacitive sensor 12 is connected, the processor may activate the third tri-state buffer 113 and the n$^{th}$ tri-state buffer 116 connected to the capacitive sensor, and deactivate remaining tri-state buffers 114 and 115.

Referring to FIG. 7B, a circuit formed according to the activation and deactivation of the tri-state buffer is illustrated. The sensing oscillator generates the sensing clock period signal $T_M$. The sensing clock period signal $T_M$ may be proportional to the $R_{ZTC}$, the $C_S$, and the element influenced by the temperature change, and the predetermined fixed clock period signal may be proportional to the $R_{ZTC}$, the $C_{INT}$, and the element influenced by the temperature change. The counter counts the sensing clock period signal $N \cdot T_M$ which is scaled up to a preset value by the frequency divider with respect to the generated fixed clock period signal and outputs the counted signal into a digital value, which will be represented as below.

$$D_{OUT\_C\text{-}MODE} = N \frac{R_{ZTC} C_S \ln\left(\frac{(\mu+1)\cdot(\mu-2)}{\mu\cdot(\mu-1)}\right)}{R_{ZTC} C_{INT} \ln\left(\frac{(\mu+1)\cdot(\mu-2)}{\mu\cdot(\mu-1)}\right)} = N \frac{C_S}{C_{INT}} \quad \text{[Equation 1]}$$

Here, μ is as shown below.

$$\mu = \frac{V_{TH}}{V_{DD}} = f(Temp) \quad \text{[Equation 2]}$$

When the capacitive sensor 12 is connected, the digital converter as in Equation 1 may output a digital value in which the capacitance value of the sensing capacitor $C_S$ is counted based on the capacitance value of the reference capacitor $C_{INT}$ of the reference oscillator. The capacitance value of the reference capacitor included in the reference oscillator may be equal to the capacitance value of the reference capacitor included in the sensing oscillator. Referring to Equation 1, the output value of the digital converter is hardly influenced by the temperature change. That is, through the proportional measurement transfer function, the influence of the matched on-chip resistor (ex. $R_{ZTC}$) which already has a small temperature coefficient TC is offset and the temperature dependence of the threshold voltage of the inverse voltage controller is offset as well and thus, the final digital output value in the C-mode may be $N \cdot (C_S/C_{INT})$, which may be temperature insensitive.

When the capacitive sensor 12 is connected to the sensing oscillator, if the sensing clock period signal and the fixed clock period signal are approximated, the sensing clock period signal $T_M$ may be similar to $2 \cdot R_{ZTC} \cdot C_S \cdot \ln(3)$ as described above. In addition, the preset fixed clock period signal $T_R$ may be similar to $2 \cdot R_{ZTC} \cdot C_{INT} \cdot \ln(3)$.

Figure 8A:
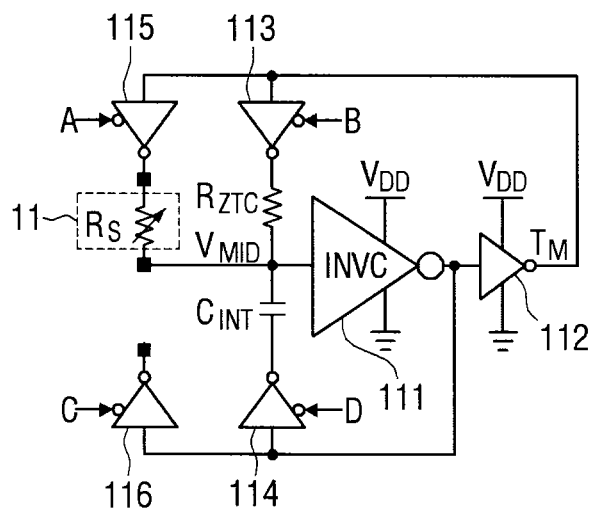
FIGS. 8A and 8B are views illustrating an embodiment in which a resistive sensor is connected.
Figure 8B:
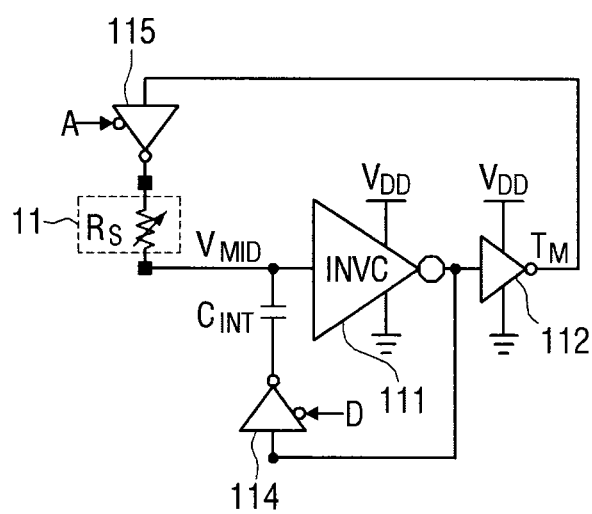

FIGS. 8A and 8B are views illustrating an embodiment in which a resistive sensor is connected.

Referring to FIG. 8A, a sensing oscillator to which the resistive sensor 11 is connected is illustrated. As described above, the sensing resistance $R_S$ of the resistive sensor 11 may be connected to the n$^{th}$ tri-state buffer 115 connected to the resistive sensor of the sensing oscillator. That is, one end and the other end of the sensing resistor $R_S$ may be respectively connected to the output terminal of the n$^{th}$ tri-state buffer 115 connected to the resistive sensor and the input terminal of the third inverse voltage controller 111.

When the resistive sensor 11 is connected, the processor may activate the fourth tri-state buffer 114 and the $n^{th}$ tri-state buffer 115 connected to the resistive sensor, and deactivate remaining tri-state buffers 113 and 116.

Referring to FIG. 8B, a circuit formed according to the activation and deactivation of the tri-state buffer is described. The sensing oscillator generates the sensing clock period signal $T_M$. The sensing clock period signal $T_M$ is obtained by replacing $R_{ZTC}$ with $R_S$ and replacing $C_S$ with $C_{INT}$ in the numerator of Equation 1. The predetermined fixed clock period signal is the same as the denominator of Equation 1. The counter counts the sensing clock period signal $N \cdot T_M$ scaled up to a predetermined value by the frequency divider based on the generated fixed clock period signal and outputs it as a digital value, which may be as the following Equation.

$$D_{OUT\_R-MODE} = N \frac{R_S}{R_{ZTC}} \qquad [\text{Equation 3}]$$

When the resistive sensor 11 is connected, the digital converter as Equation 3 may output the digital value in which the resistance value of the sensing resistance $R_S$ is counted based on the resistance value of the $R_{ZTC}$ of the reference oscillator. The resistance value of the $R_{ZTC}$ included in the reference oscillator may be the same as the resistance value of the $R_{ZTC}$ included in the sensing oscillator. Referring to FIG. 3, the output value of the digital converter is hardly affected by the temperature change. That is, through the proportional measurement transfer function, the influence of the matched on-chip capacitor $C_{INT}$ which already has a small temperature coefficient TC is offset and, in addition, the temperature dependence of the threshold voltage of the inverse voltage controller is offset as well and thus, the final digital output value in the R-mode may be $N \cdot (R_S/R_{ZTC})$, which may be temperature insensitive.

When the resistive sensor 11 is connected to the sensing oscillator, if the sensing clock period signal and the fixed clock period signal are approximated, the sensing clock signal $T_M$ may be similar to $2 \cdot R_S \cdot C_{INT} \cdot \ln(3)$. The predetermined fixed clock period signal $T_R$ may be similar to $2 \cdot R_{ZTC} \cdot C_{INT} \cdot \ln(3)$.

Figure 9:
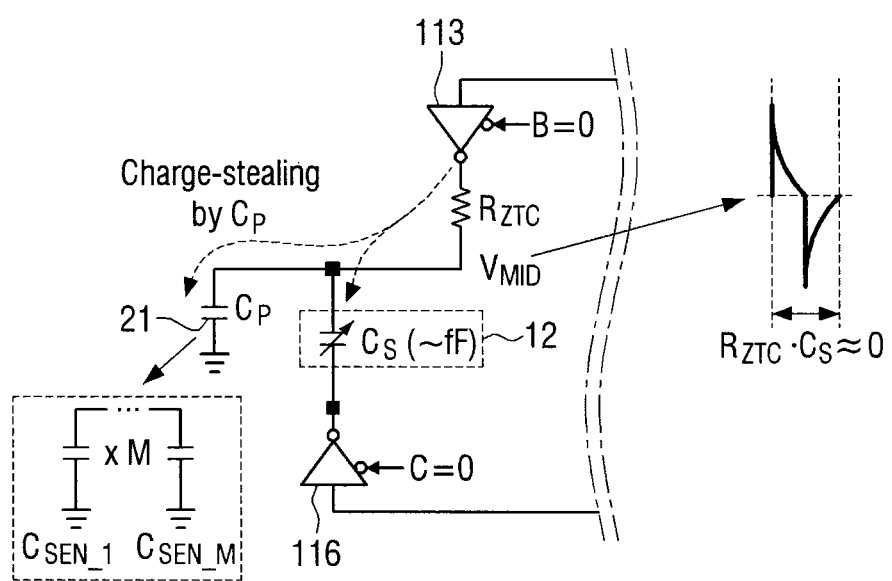
FIG. 9 is a view describing an influence of a parasitic capacitance and a capacitive sensor having a small value according to an embodiment.

FIG. 9 is a view describing an influence of a parasitic capacitance and a capacitive sensor having a small value according to an embodiment.

Referring to FIG. 9, the influence of a parasitic capacitor in the C-mode is illustrated. The sensing capacitor $C_S$ having a capacitance value of fF units in the C-mode may make the $R_{ZTC} \cdot C_S$ almost as a zero value so that the sensing oscillator may not operate. In addition, the sensing node $V_{MID}$ may be shared across multiple sensors and may be influenced by the capacity value of the large parasitic capacitor $C_P$ due to a parallel connection of parasitic capacitors of a plurality of capacitive sensors. The parasitic capacitor $C_P$ may reduce the sensing accuracy by reducing the original charge amount of the sensing capacitor and generating an offset and a non-linearity error. In order to eliminate the influence of the parasitic capacitor $C_P$, the digital converter may be reconfigured to the SC-mode.

Figure 10A:
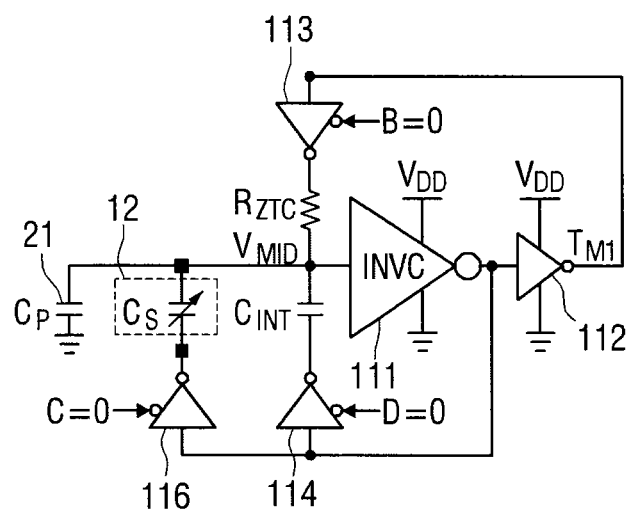
FIGS. 10A to 11 are views to describe an embodiment of eliminating an influence of a parasitic capacitance.
Figure 10B:
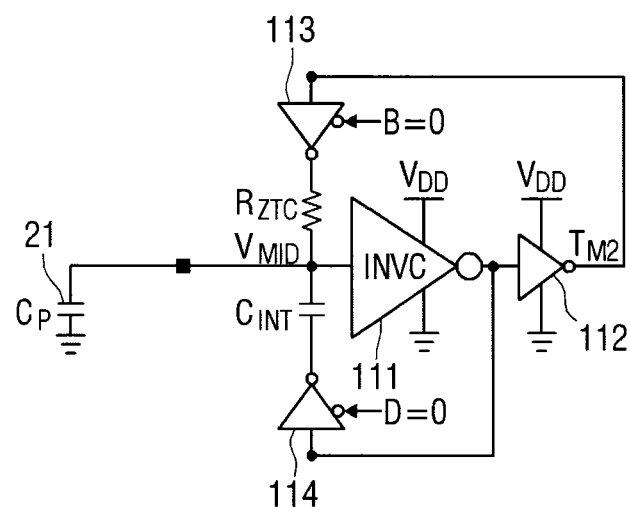
Figure 11:
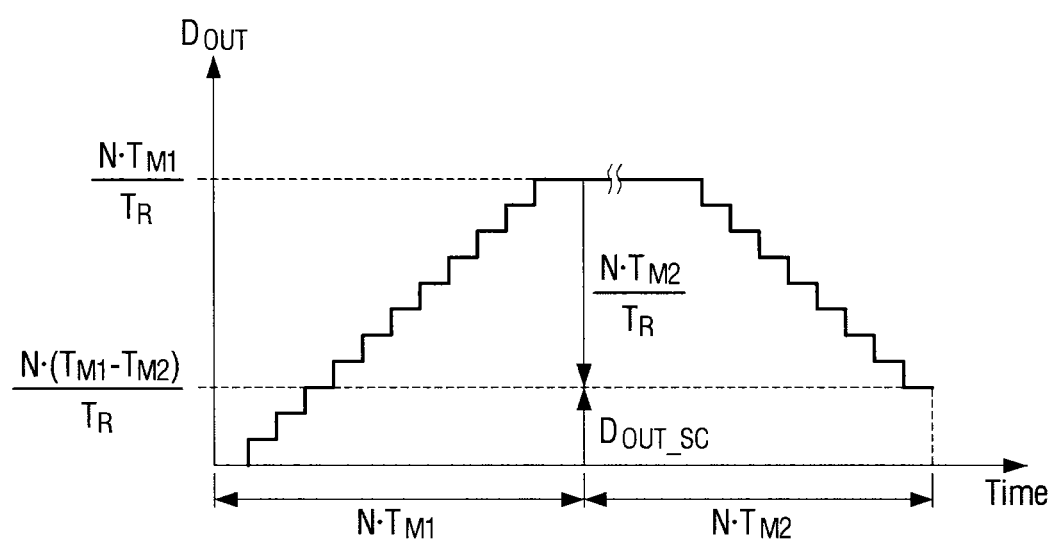

FIGS. 10A to 11 are views to describe an embodiment of eliminating an influence of a parasitic capacitance.

Referring to FIG. 10A, a first stage structure of the SC-mode is illustrated. The digital converter may activate the third tri-state buffer 113, the fourth tri-state buffer 114, and the $n^{th}$ tri-state buffer 116 connected to the capacitive sensor of the sensing oscillator in the first stage of the SC-mode. Therefore, the $C_{INT}$, the sensing capacity $C_S$ of the capacitive sensor 12 and the parasitic capacitor $C_P$ 21 may be connected in parallel. The capacitance in which the capacitance values of the reference capacitor $C_{INT}$, sensing capacitor $C_S$, and the parasitic capacitor $C_P$ 21 are added may increase time constant so as to operate the sensing oscillator. The first sensing clock period signal $T_{M1}$ which is the sensing clock period signal of the sensing oscillator in the first stage of the SC-mode is as shown in the Equation below.

$$T_{M1} = 2 \cdot R_{ZTC} \cdot (C_{INT} + C_S + C_P) \cdot \ln\left(\frac{3(C_{INT} + C_S) + C_P}{(C_{INT} + C_S) + C_P}\right) \qquad [\text{Equation 4}]$$

$$\approx 2 \cdot R_{ZTC} \cdot (C_{INT} + C_S + C_P) \cdot \ln(3)$$

That is, the first sensing clock period signal $T_{M1}$ may be similar to $2 \cdot R_{ZTC} \cdot (C_S + C_{INT} + C_P) \cdot \ln(3)$ which has offset by $C_{INT}$ and $C_P$. The counter may count up the sensing value during $N \cdot T_{M1}$.

Referring to FIG. 10B, the second stage structure of the SC-mode is illustrated. When the first stage of the SC-mode ends, the digital converter may maintain activation of the third tri-state buffer 113 and the fourth tri-state buffer 114 of the sensing oscillator, and deactivate the $n^{th}$ tri-state buffer 116 connected to the capacitive sensor, in the second stage. Therefore, the reference capacitor $C_{INT}$ and the parasitic capacitor $C_P$ 21 may be connected in parallel. The second sensing clock period signal $T_{M2}$ which is the sensing clock period signal of the sensing oscillator in the second stage of the SC-mode is as shown in the Equation below.

$$T_{M2} = 2 \cdot R_{ZTC} \cdot (C_{INT} + C_P) \cdot \ln\left(\frac{3C_{INT} + C_P}{C_{INT} + C_P}\right) \qquad [\text{Equation 5}]$$

$$\approx 2 \cdot R_{ZTC} \cdot (C_{INT} + C_P) \cdot \ln(3)$$

That is, the second sensing clock period signal $T_{M2}$ may be similar to $2 \cdot R_{ZTC} \cdot (C_{INT} + C_P) \cdot \ln(3)$. The counter may count down the sensing value during $N \cdot T_{M2}$. The final output sensing value is as the Equation below.

$$D_{OUT\_SC} = \frac{N \cdot (C_{INT} + C_S + C_P) - N \cdot (C_{INT} + C_P)}{C_{INT}} = \frac{N \cdot C_S}{C_{INT}} \qquad [\text{Equation 6}]$$

The offset by the $C_{INT}$ and the $C_P$ may be eliminated by the difference between the count-up value calculated in the first stage and the count-down value calculated in the second stage, and the final digital output value may be $N \cdot (C_S/C_{INT})$.

Referring to FIG. 11, the output waveform in the first stage and the second stage of the SC-mode is illustrated. As described above, the digital converter may activate the third tri-state buffer 113, the fourth tri-state buffer 114, and the $n^{th}$ tri-state buffer 116 connected to the capacitive sensor of the sensing oscillator. The digital converter may calculate the count-up value by counting up the sensing clock period signal which is proportional to a sum of capacitance values of the reference capacitor $C_{INT}$, the sensing capacitor $C_S$ of the capacitive sensor 12, and the parasitic capacitor $C_P$ 21, during a preset first time $N \cdot T_{M1}$. After the first time, the digital converter may maintain activation of the third tri-state buffer 113, the fourth tri-state buffer 114 of the sensing oscillator, and deactivate the $n^{th}$ tri-state buffer 116 connected to the capacitor sensor. The digital converter may calculate the count-down value by counting down the sensing clock period signal which is proportional to the sum of the capacitance values of the reference capacitor $C_{INT}$ and the parasitic capacitor $C_P$ 21 during a predetermined second time $N \cdot T_{M2}$.

The digital converter may calculate a difference value between the calculated count-up value and the count-down value, and output the calculated difference value into a digital sensing value. Therefore, the digital converter may eliminate the influence of the parasitic capacitor $C_P$ for the sensing capacitor $C_S$ through the SC-mode.

Figure 12:
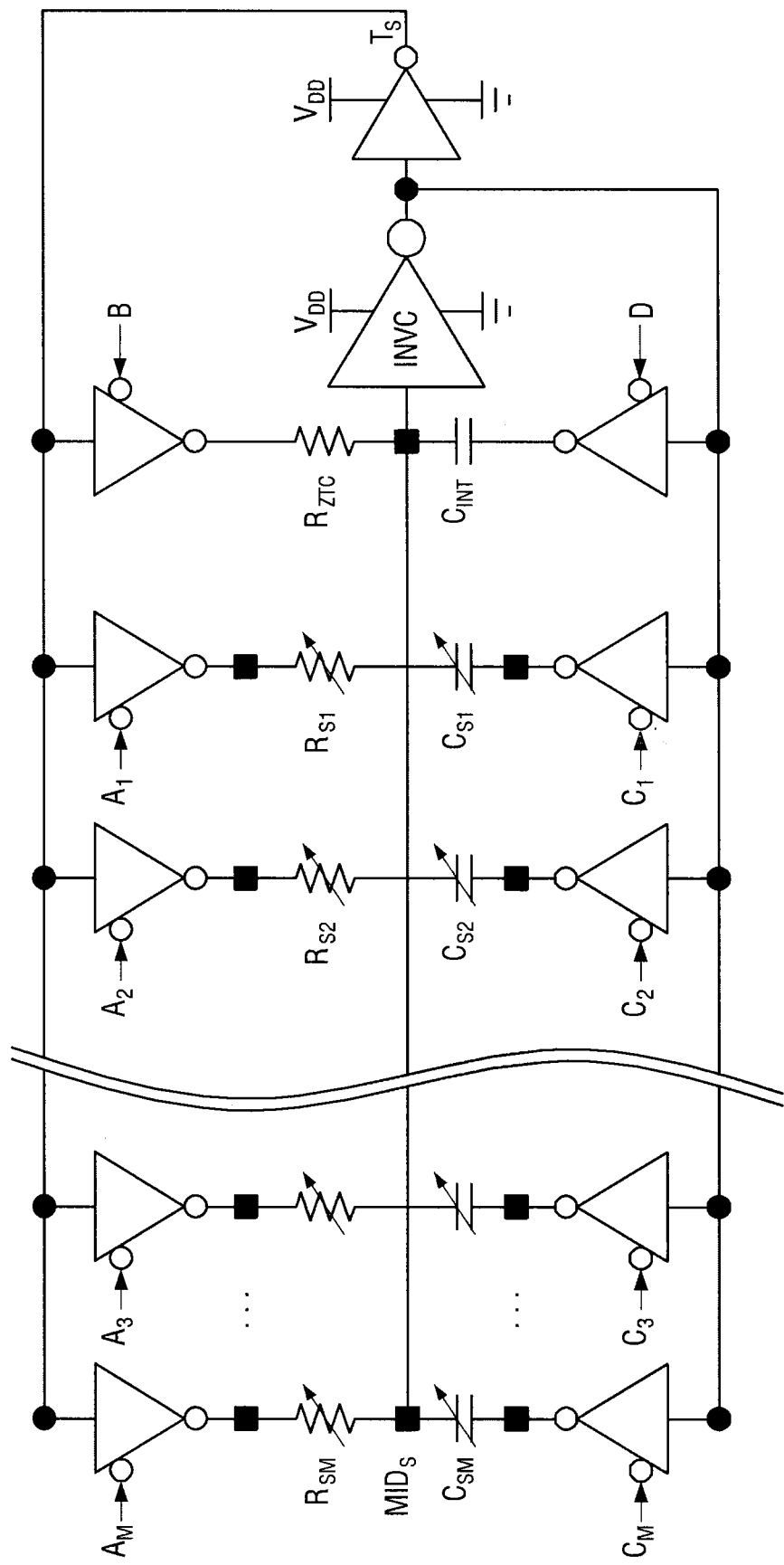
FIG. 12 is a view describing an embodiment in which a plurality of resistive sensors are connected with capacitive sensors.

FIG. 12 is a view describing an embodiment in which a plurality of resistive sensors are connected with capacitive sensors.

Referring to FIG. 12, the sensing oscillator in which a plurality of resistive sensors and capacitive sensors are simultaneously connected is illustrated. As described above, the digital converter may be connected with the resistive sensor and the capacitive sensor, and an extended sensing system may be implemented in which a plurality of resistive sensors and capacitive sensors are connected along with additional tri-state buffers. Therefore, the digital converter may apply the operations of the R-mode, C-mode, RC-mode, and SC-mode to a case of sensing a plurality of resistive sensors and capacitive sensors in the same manner.

FIGS. 13A to 14D are views illustrating an experiment result of a digital converter according to an embodiment.

Figure 13B:
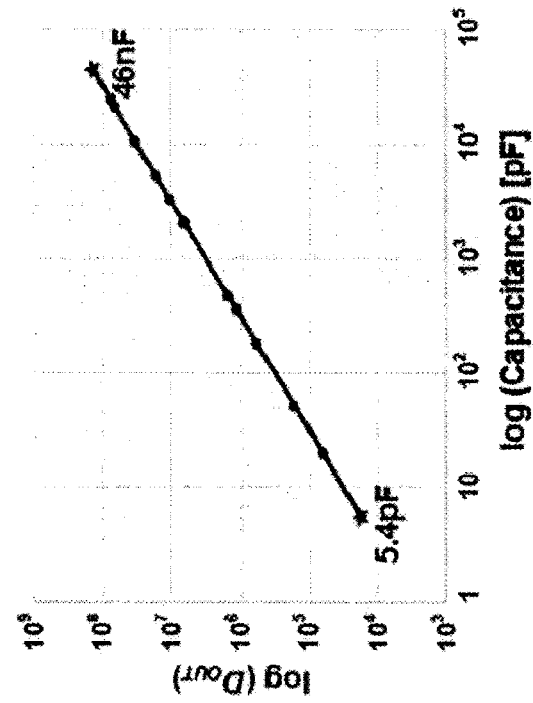
Figure 13D:
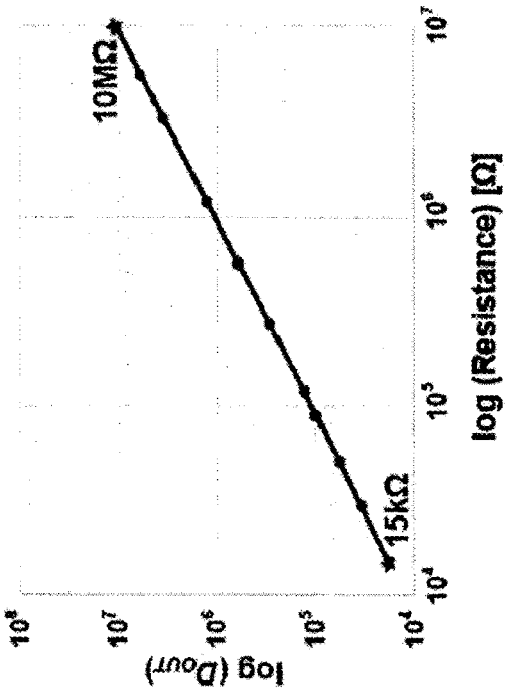
Figure 13A:
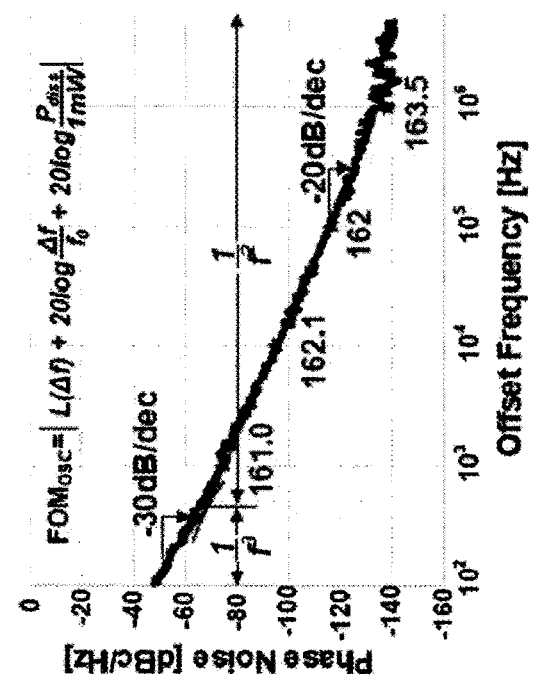
Figure 13C:
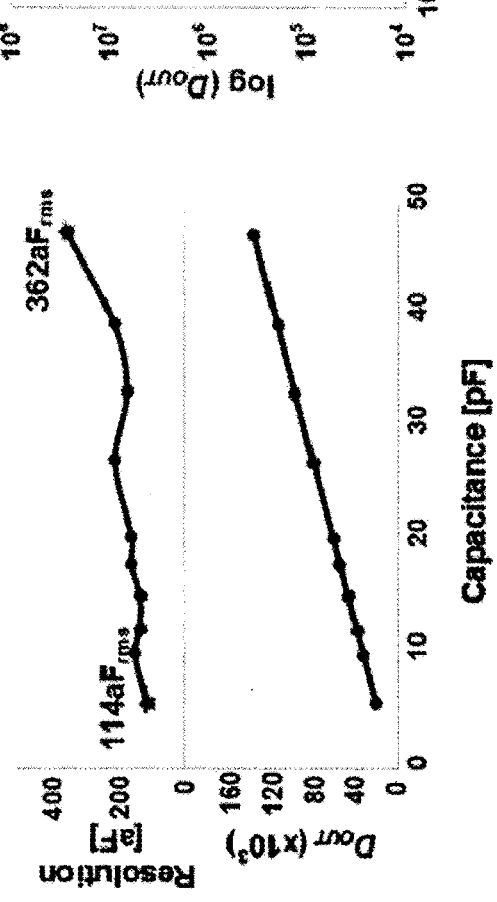

As an embodiment, the digital converter which is implemented with 0.18 µm standard CMOS process may have a space of 0.175 mm², consume 140 µA in the 1V power, and 70% may be consumed in the RC branch. As illustrated in FIG. 13A, the figure of merit (FOM) of phase noise of the oscillator may be 161 dBc/Hz or higher in the offset frequency between 1 kHz and 1 MHz. As illustrated in FIG. 13B, the digital converter of the disclosure has a structure of time base and thus may have a wide capacitance input range of 46 nF. As illustrated in FIG. 13C, the 1/f noise and the offset (phase noise 1/f² corner at 400 Hz) are inherently cancelled and the capacitance resolution may become worse merely from 114 aFrms to 362 aFrms, over the range of 5.4 pF to 47.6 pF. The digital converter shows the FOM of the 3.92 pJ/conversion step during the measurement time of 2.93 ms at 5.4 pF, and this shows a better result than the time-based sensing method previously reported. As illustrated in FIG. 13D, the digital converter of the disclosure has a wide resistance input range of 10 MΩ.

Figures 14A, 14B, 14C, 14D:
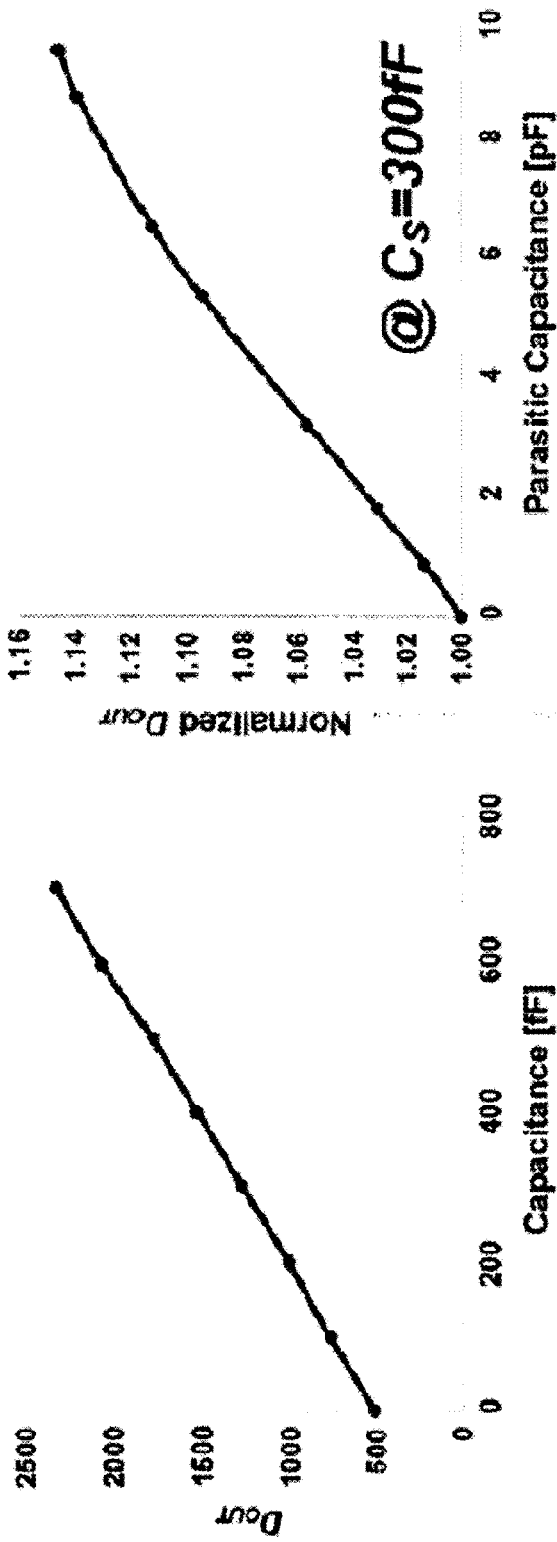

FIG. 14A illustrates a sensing result in the case where the sensing capacitor $C_S$ in the SC-mode is very small femto-farad which is between 0 F to 700 fF. Referring to FIG. 14A, when the sensing capacitor $C_S$ value is 0, the output value by the parasitic capacitor which is formed between the pads is not 0. Referring to FIG. 14B, when the sensing capacitor $C_S$ is 300 fF, even when significantly large parasitic capacitance (for example, 30 times or more of the sensing capacity) is present, the output code increased merely by 16%. Referring to FIGS. 14C and 14D, an interleave mode (RC-mode) for sensing through the time crossing method in which the R-mode in which the resistive sensor (for example, temperature sensor) is connected and the C-mode in which the capacitive sensor (for example, humidity sensor) alternately operate.

The digital converter of the disclosure does not require an external clock signal or additional data processing and is entirely independent. In addition, the digital converter includes functions such as efficient power dissipation, wide input range and excellent resolution, robustness and variability to temperature changes, and the ability to sense a plurality of resistive and capacitive sensors and thus may be widely used as a stand-alone and low-cost IoT application.

Until now, various embodiments of the digital converter have been described. Hereinbelow, a controlling method of the digital converter will be described.

Figure 15:
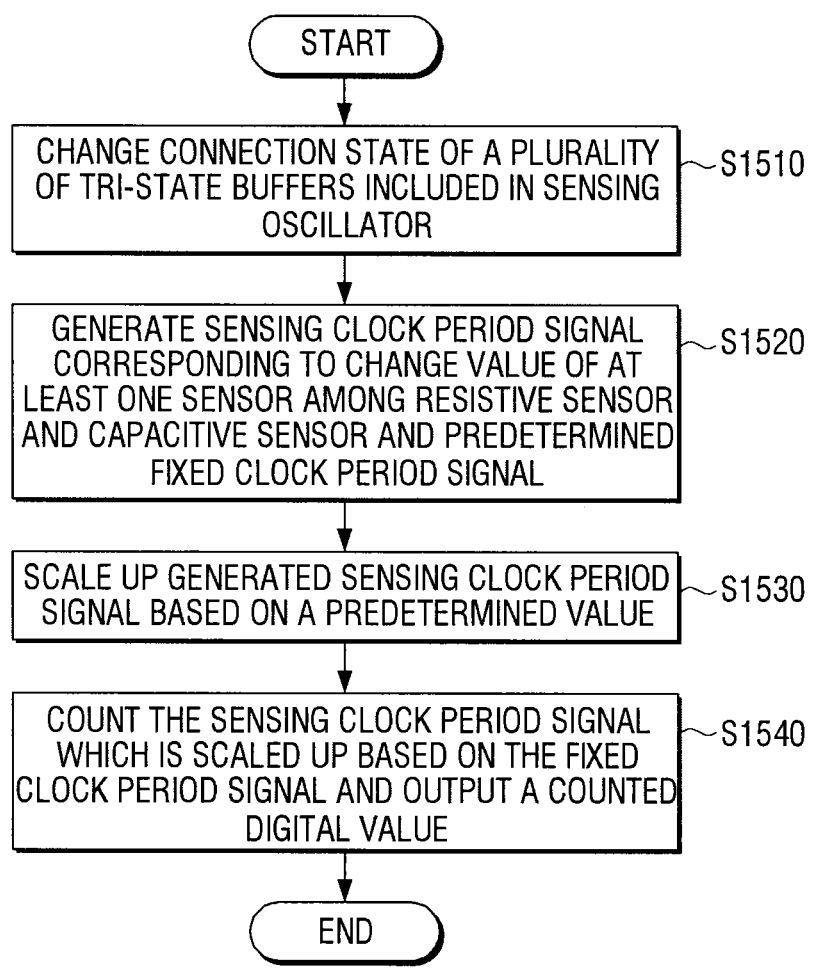
FIG. 15 is a flowchart of a control method of a digital converter according to an embodiment.

FIG. 15 is a flowchart of a control method of a digital converter according to an embodiment.

Referring to FIG. 15, the digital converter changes the connection state of a plurality of tri-state buffers included in the sensing oscillator in step S1510. In one embodiment, the digital converter may include a C-mode in which the capacitive sensor is connected, the R-mode in which the resistive sensor is connected, the RC-mode in which both the capacitive sensor and the resistive sensor are connected at the same time, and the SC-mode to remove the influence of the parasitic capacity. In the C-mode, the digital converter activates the third tri-state buffer connected to the zero temperature coefficient resistor of the sensing oscillator and the $n^{th}$ tri-state buffer connected to the capacitive sensor, and deactivates the other tri-state buffers. In the R-mode, the digital converter activates the fourth tri-state buffer connected with the reference capacitor of the sensing oscillator and the $n^{th}$ tri-state buffer connected to the resistive sensor, and deactivates other tri-state buffers.

In the case of the RC-mode, the digital converter may sequentially perform R-mode and C-mode operation for a predetermined period of time in an alternate manner, and perform sensing through the time crossing method. In the SC-mode, the digital converter activates the third tri-state buffer connected to the zero-temperature coefficient resistor of the sensing oscillator for a first time, the fourth tri-state buffer connected to the reference capacitor, and the $n^{th}$ tri-state buffer connected to the capacitive sensor. After the first time, the digital converter maintains the activation of the third tri-state buffer and the fourth tri-state buffer connected to the reference capacitor, and deactivates the $n^{th}$ tri-state buffer connected to the capacitive sensor.

The digital converter generates a sensing clock period signal and a predetermined fixed clock period signal corresponding to a change value of the sensor of at least one of the resistive sensor and the capacitive sensor in step S1520. When the resistive sensor is connected, the sensing clock period signal is proportional to the resistance value of the sensing resistor included in the resistive sensor, and when the capacitive sensor is connected, the sensing clock period signal is proportional to the capacitance value of the sensing capacitor included in the capacitive sensor.

The digital converter scales up the generated sensing clock period signal based on a predetermined value in step S1530. The digital converter counts the scaled-up sensing clock period signal based on the generated fixed clock period signal and outputs the counted signal as a digital value in step S1540. When the capacitive sensor is connected, the output digital value is proportional to the capacitance value of the sensing capacitor relative to the capacitance value of the reference capacitor, and the digital value which is outputted when the resistance sensor is connected is proportional to the resistance value of the sensing resistor compared to the resistance value of the zero temperature coefficient resistance.

The controlling method of the digital converter according to the various embodiments described above may be provided as a computer program product. The computer program product may include a software program itself or a non-transitory computer readable medium in which the software program is stored.

The non-transitory computer readable medium refers to a medium that stores data semi-permanently rather than storing data for a very short time, such as a register, a cache, a memory or etc., and is readable by an apparatus. In detail, the aforementioned various applications or programs may be stored in the non-transitory computer readable medium, for example, a compact disc (CD), a digital versatile disc (DVD), a hard disc, a Blu-ray disc, a universal serial bus (USB), a memory card, a read only memory (ROM), and the like, and may be provided.

The foregoing embodiments and advantages are merely exemplary and are not to be construed as limiting the disclosure. The present teaching may be readily applied to other types of devices. Also, the description of the embodiments of the disclosure is intended to be illustrative, and not to limit the scope of the claims, and many alternatives, modifications, and variations will be apparent to those skilled in the art.

What is claimed is:

1. A digital converter comprising:
a sensing oscillator including a plurality of tri-state buffers configured to generate a sensing clock period signal corresponding to a change value of at least one of a resistive sensor and a capacitive sensor;
a reference oscillator configured to generate a predetermined fixed clock period signal;
a processor configured to change a connection state of the plurality of tri-state buffers;
a frequency divider configured to scale up the generated sensing clock period signal based on a predetermined value; and
a counter configured to count the scaled up sensing clock period signal based on the generated fixed clock cycle signal and output a counted digital value,
wherein the reference oscillator comprises:
a first inverse voltage controller, a second inverse voltage controller, a first tri-state buffer, and a second tri-state buffer,
wherein an output terminal of the first tri-state buffer is connected to an end of a first zero temperature coefficient resistor that is robust to temperature change, and an output terminal of the second tri-state buffer is connected to an end of a first reference capacitor,
wherein an input terminal of the first inverse voltage controller is connected to another end of the first zero temperature coefficient resistor and another end of the first reference capacitor,
wherein the output terminal of the first inverse voltage controller is connected to an input terminal of the second tri-state buffer and an input terminal of the second inverse voltage controller, and
wherein an output terminal of the second inverse voltage controller is connected to an input terminal of the first tri-state buffer, and the predetermined fixed clock period signal which is proportional to a resistance value of the first zero temperature coefficient resistor and a capacitance value of the first reference capacitor is outputted.

2. The digital converter of claim 1,
wherein the sensing oscillator comprises a third inverse voltage controller and a fourth inverse voltage controller,
wherein the plurality of tri-state buffers comprise a third tri-state buffer, a fourth tri-state buffer, and at least one $n^{th}$ tri-state buffer,
wherein an output terminal of the third tri-state buffer is connected to an end of a second zero temperature coefficient resistor which is robust to temperature change, and an output terminal of the fourth tri-state buffer is connected to an end of a second reference capacitor,
wherein an input terminal of the third inverse voltage controller is connected to another end of the second zero temperature coefficient resistor and another end of the second reference capacitor,
wherein an output terminal of the third inverse voltage controller is connected to an input terminal of the fourth tri-state buffer, an input terminal of at least one $n^{th}$ tri-state buffer, and an input terminal of the fourth inverse voltage controller, and
wherein an output terminal of the fourth inverse voltage controller is connected to an input terminal of the third tri-state buffer and an input terminal of at least one $n^{th}$ tri-state buffer which is connected to the resistive sensor, and the sensing clock period signal is outputted.

3. The digital converter of claim 2,
wherein the first zero temperature coefficient resistor and the second zero temperature coefficient resistor have a same resistance value, and the first reference capacitor and the second reference capacitor have a same capacitance value.

4. The digital converter of claim 2,
wherein, when the resistive sensor is connected to the digital converter, both ends of a sensing resistor included in the resistive sensor is connected to the third inverse voltage controller and the $n^{th}$ tri-state buffer which is connected to the resistive sensor, respectively, and the processor turns on the fourth tri-state buffer and the $n^{th}$ tri-state buffer which is connected to the resistive sensor.

5. The digital converter of claim 4,
wherein the sensing clock period signal is proportional to a resistance value of the sensing resistor and the capacitance value of the second reference capacitor, and
wherein the counter outputs a digital value in which the resistance value of the sensing resistor is counted based on the resistance value of the first zero temperature coefficient resistor.

6. The digital converter of claim 2,
wherein, when the capacitive sensor is connected to the digital converter, both ends of a sensing capacitor included in the capacitive sensor is connected to the third inverse voltage controller and $n^{th}$ tri-state buffer which is connected to the capacitive sensor, respectively, and the processor turns on the third tri-state buffer and the $n^{th}$ tri-state buffer which is connected to the capacitive sensor.

7. The digital converter of claim 6,
wherein the sensing clock period signal is proportional to a resistance value of the second zero temperature coefficient resistor and the capacitance value of the sensing capacitor, and
wherein the counter outputs a digital value in which the capacitance value of the sensing capacity is counted based on the capacitance value of the first reference capacitor.

8. The digital converter of claim 2,
wherein, when the capacitive sensor is connected to the digital converter and includes a parasitic capacitance, the sensing oscillator connects an end and another end of a sensing capacitor included in the capacitive sensor respectively to an output terminal of the $n^{th}$ tri-state buffer connected to the capacitive sensor and an input terminal of the third inverse voltage controller,
wherein the counter counts up the sensing clock period signal which is proportional to an accumulated value of a capacitance value of the second reference capacitor, a capacitance value of the sensing capacitor, and a capacitance value of the parasitic capacitance for a first time, counts down the sensing clock period signal which is proportional to an accumulated value of a capacitance value of the second reference capacitor and a capacitance value of the parasitic capacitor for a second time, after the first time, and
wherein the processor turns on the third tri-state buffer, a fourth tri-state buffer, and the $n^{th}$ tri-state buffer connected to the capacitive sensor for the first time, turns off the $n^{th}$ tri-state buffer connected to the capacitive sensor after the first time, calculates a difference value of a count-up value calculated by the count-up and a count-down value calculated by the count-down, and controls the counter to output the calculated difference value into a digital value.

* * * * *